(12) United States Patent
Jang et al.

(10) Patent No.: US 8,999,740 B2
(45) Date of Patent: Apr. 7, 2015

(54) SOLAR CELL

(75) Inventors: Daehee Jang, Seoul (KR); Jihoon Ko, Seoul (KR); Juwan Kang, Seoul (KR); Jonghwan Kim, Seoul (KR)

(73) Assignee: LG Electronics Inc., Seoul (KR)

( * ) Notice: Subject to any disclaimer, the term of this patent is extended or adjusted under 35 U.S.C. 154(b) by 433 days.

(21) Appl. No.: 13/616,760

(22) Filed: Sep. 14, 2012

(65) Prior Publication Data

US 2013/0005070 A1  Jan. 3, 2013

Related U.S. Application Data

(63) Continuation of application No. 12/910,093, filed on Oct. 22, 2010, now Pat. No. 8,288,648, which is a continuation of application No. 12/559,551, filed on Sep. 15, 2009, now Pat. No. 7,838,762.

(30) Foreign Application Priority Data

May 14, 2009  (KR) ........................ 10-2009-0042220

(51) Int. Cl.
| | | |
|---|---|---|
| H01L 31/0232 | (2014.01) | |
| H01L 31/068 | (2012.01) | |
| H01L 31/18 | (2006.01) | |
| H01L 31/0216 | (2014.01) | |
| H01L 31/0224 | (2006.01) | |

(52) U.S. Cl.
CPC ............ *H01L 31/068* (2013.01); *H01L 31/182* (2013.01); *H01L 31/1804* (2013.01); *H01L 31/18* (2013.01); *H01L 31/02168* (2013.01); *H01L 31/02245* (2013.01); *Y02E 10/547* (2013.01)

(58) Field of Classification Search
CPC ............ H01L 31/02168; H01L 31/068; H01L 31/02245; H01L 31/18; H01L 31/1804; H01L 31/182; Y02E 10/547

USPC ........ 438/47, 72, 98, 618, 637; 136/252, 256, 136/261; 257/E31.127

See application file for complete search history.

(56) References Cited

U.S. PATENT DOCUMENTS

| | | |
|---|---|---|
| 6,384,317 B1 | 5/2002 | Kerschaver et al. |
| 2004/0261840 A1 | 12/2004 | Schmit et al. |
| 2005/0176164 A1 | 8/2005 | Gee et al. |
| 2008/0179756 A1 | 7/2008 | Kamins et al. |
| 2008/0185038 A1 | 8/2008 | Sharps |
| 2011/0057283 A1 | 3/2011 | Tsunemi et al. |

FOREIGN PATENT DOCUMENTS

| | | |
|---|---|---|
| CN | 1860618 A | 11/2006 |
| JP | 63-211773 A | 9/1988 |
| JP | 2002-305360 A | 10/2002 |
| JP | 2003-060219 A | 2/2003 |
| JP | 2004-95669 A | 3/2004 |
| JP | 2008-193089 A | 8/2008 |
| JP | 2009-59921 A | 3/2009 |
| KR | 1020070072986 A | 7/2007 |
| KR | 1020070099938 A | 10/2007 |

*Primary Examiner* — Matthew Martin
(74) *Attorney, Agent, or Firm* — Birch, Stewar, Kolasch & Birch, LLP (57) ABSTRACT

A solar cell according to an embodiment of the invention includes a substrate configured to have a plurality of via holes and a first conductive type, an emitter layer placed in the substrate and configured to have a second conductive type opposite to the first conductive type, a plurality of first electrodes electrically coupled to the emitter layer, a plurality of current collectors electrically coupled to the first electrodes through the plurality of via holes, and a plurality of second electrodes electrically coupled to the substrate. The plurality of via holes includes at least two via holes having different angles.

8 Claims, 7 Drawing Sheets

SOLAR CELL

This application is a Continuation of co-pending U.S. application Ser. No. 12/910,093 filed on Oct. 22, 2010, which is a Continuation of U.S. application Ser. No. 12/559,551 filed on Sep. 15, 2009 (now U.S. Pat. No. 7,838,762), which claims priority to and the benefit of Patent Application No. 10-2009-0042220 filed in the Korean Intellectual Property Office on May 14, 2009. The entire contents of all of the above applications are hereby incorporated by reference.

BACKGROUND OF THE INVENTION

1. Field of the Invention

The present invention relates to a solar cell.

2. Discussion of the Related Art

In recent years, with the expected exhaustion of the existing energy resources such as petroleum or coal, there is a growing interest in alternate energy sources which will substitute for existing energy resources. From among them, a solar cell is configured to generate electrical energy from solar energy, and it has been in the spotlight because solar energy can be easily obtained and has no problems with environmental pollution.

A typical solar cell includes a substrate and an emitter layer made of semiconductors having different conductive types such as a p type or an n type, and electrodes coupled to the substrate and the emitter layer. Here, a PN junction is formed at the interface of the substrate and the emitter layer.

When light is incident on the solar cell, a plurality of electron-hole pairs are generated from the semiconductors, and the generated electron-hole pairs are separated into electrons and holes (i.e., electric charges) by a photovoltaic effect. The electrons and the holes move toward the n-type semiconductor and the p-type semiconductor (e.g., the emitter layer and the substrate) and are collected by the electrodes electrically coupled to the substrate and the emitter layer. The electrodes are interconnected by electric wires, thereby allowing electric power to be obtained.

Here, one or more current collectors, such as bus bars coupled to the electrodes coupled to the emitter layer and the substrate, are placed over the emitter layer and the substrate. The current collectors function to move electric charges, collected by corresponding electrodes, to an external load through adjacent current collectors.

In this case, the current collectors are placed over not only the substrate on which light is not incident, but the emitter layer formed on a surface on which light is incident (i.e., a light-receiving surface). Accordingly, the efficiency of the solar cell is low because an area on which light is incident on the substrate is decreased by the current collectors.

In order to reduce the decrease in the efficiency of the solar cell resulting from placement of the current collectors on a light-receiving surface of the substrate, a metal wrap through (MWT) solar cell, etc., have been developed wherein the current collectors coupled to the emitter layer through via holes are placed on the rear surface of the substrate, placed on an opposite side to the light-receiving surface.

SUMMARY OF THE INVENTION

According to an aspect of the present invention, a solar cell may include a substrate configured to have a plurality of via holes and a first conductive type; an emitter layer placed in the substrate and configured to have a second conductive type opposite to the first conductive type; a plurality of first electrodes electrically coupled to the emitter layer; a plurality of current collectors electrically coupled to the first electrodes through the plurality of via holes; and a plurality of second electrodes electrically coupled to the substrate, wherein the plurality of via holes comprise at least two via holes having different angles.

The at least two angles may be different depending on places where the via holes are formed.

The at least two via holes may have different horizontal sectional shapes.

As the angle increases, the horizontal sectional shape of the via hole may be close to a circle.

The at least two via holes may have different sectional areas.

A size of the sectional area may increase as the angle of the via hole decreases.

The plurality of via holes may include at least two via holes having a same angle.

The at least two via holes may be placed in a same row.

The at least two via holes may be placed in a same column.

The at least two via holes may be placed at a same distance from via holes having a maximum angle.

Each of the different angles may be about 45° to 90° with the substrate.

According to an aspect of the present invention, a method of forming a solar cell includes forming a plurality of via holes in a substrate of a first conductive type; forming an emitter layer in the substrate, the emitter layer being a second conductive type opposite to the first conductive type; forming a plurality of first electrodes electrically coupled to the emitter layer; forming a plurality of current collectors electrically coupled to the first electrodes through the plurality of via holes; and forming a plurality of second electrodes electrically coupled to the substrate, wherein the plurality of via holes are formed so that at least two via holes have different angles.

BRIEF DESCRIPTION OF THE DRAWINGS

The above and other objects and features of the present invention will become apparent from the following description of preferred embodiments given in conjunction with the accompanying drawings, in which.

DETAILED DESCRIPTION OF THE EMBODIMENTS

Hereinafter, embodiments of the present invention will be described in detail with reference to the accompanying drawings in order for those skilled in the art to be able to implement the invention. As those skilled in the art would realize, the following embodiments may be modified in various different ways and the present invention is not limited to the embodiments. Wherever possible, the same reference numbers will be used throughout the drawings to refer to the same or like parts.

To clarify multiple layers and regions, the thickness of the layers is enlarged in the drawings. Like reference numerals designate like elements throughout the specification. When it is said that any part, such as a layer, film, region, or plate, is positioned on another part, it refers to the part being directly on the other part or above the other part with at least one intermediate part. On the other hand, if any part is said to be positioned directly on another part it refers to there being no intermediate part between the two parts. In the specification, when it is said that any part is "entirely" formed on another part, it refers to the part being not formed on not only the entire surface of the other part, but part of the edge of the surface.

A solar cell according to an embodiment of the present invention is described below with reference to the accompanying drawings. First, a solar cell according to ane embodiment of the present invention is described in detail with reference to FIGS. 1 to 7.

Figure 1:
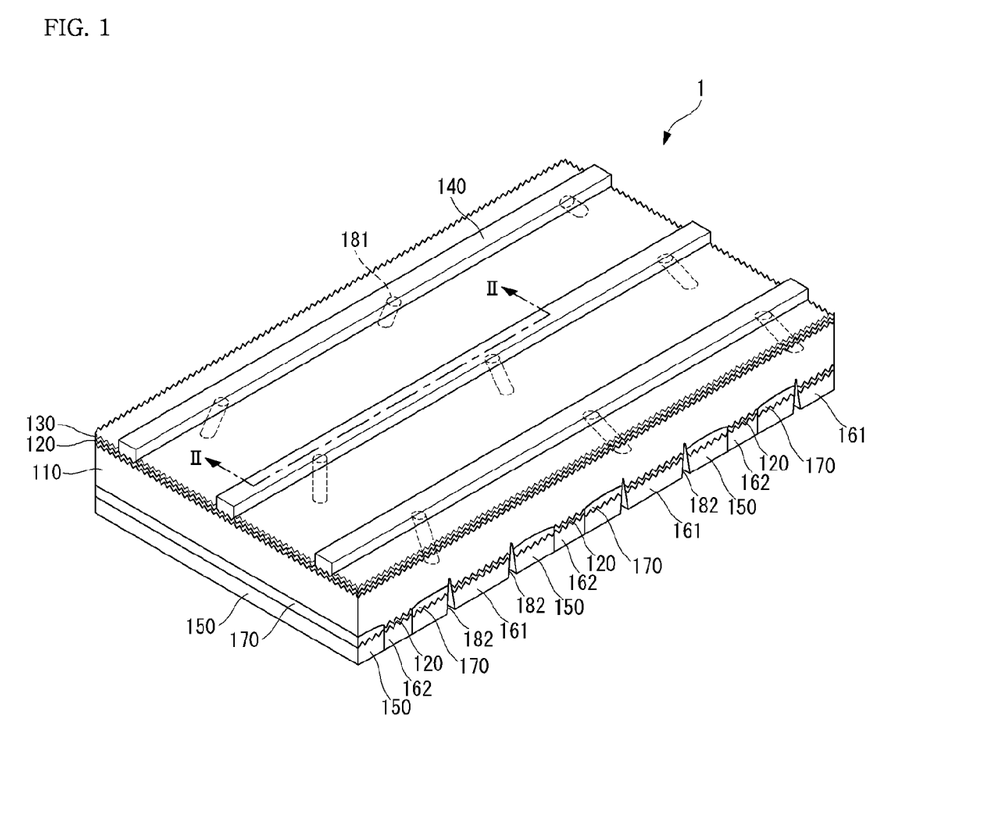
FIG. 1 is a partial perspective view of a solar cell according to an embodiment of the present invention.
Figure 2:
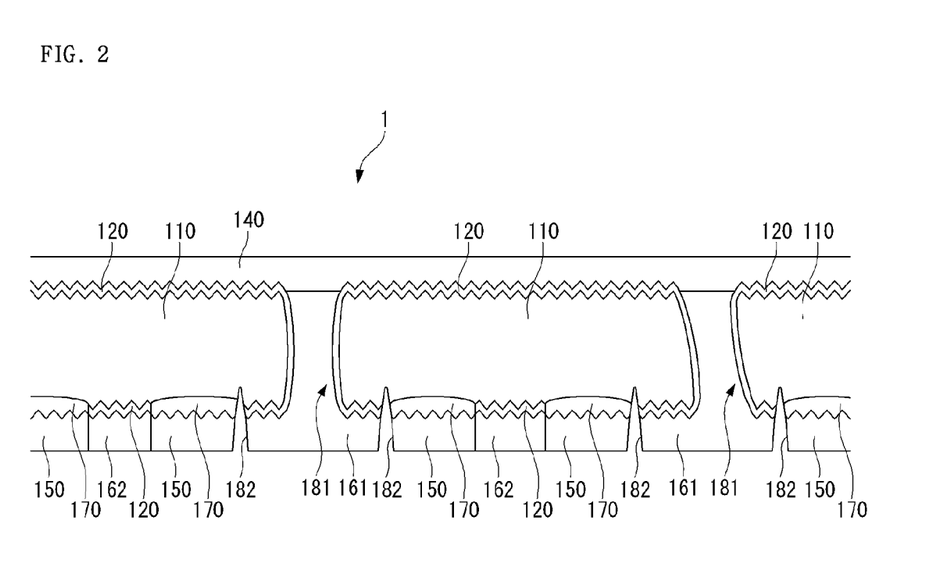
FIG. 2 is a sectional view of the solar cell taken along line II-II in FIG. 1.
Figure 3:
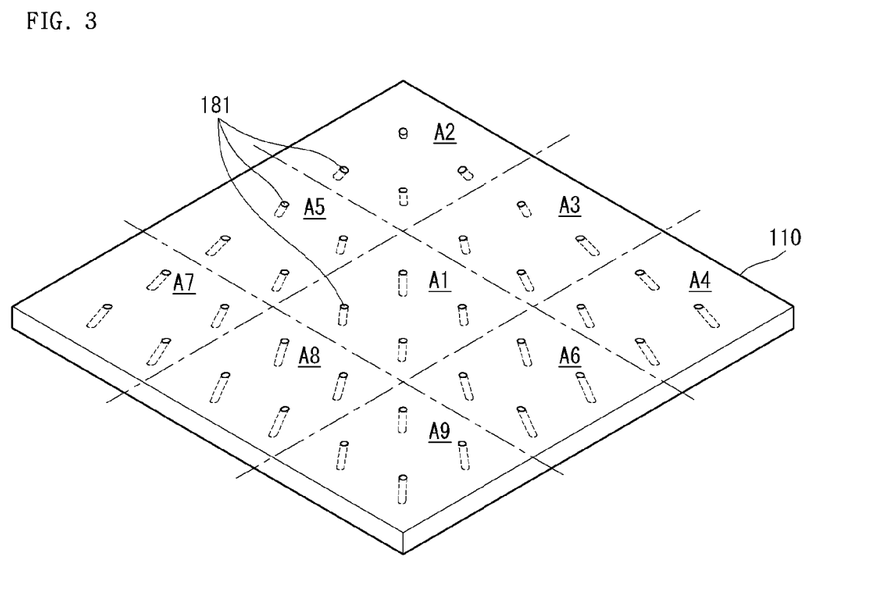
FIG. 3 is a diagram showing via holes formed in a substrate according to an embodiment of the present invention.
Figure 4:
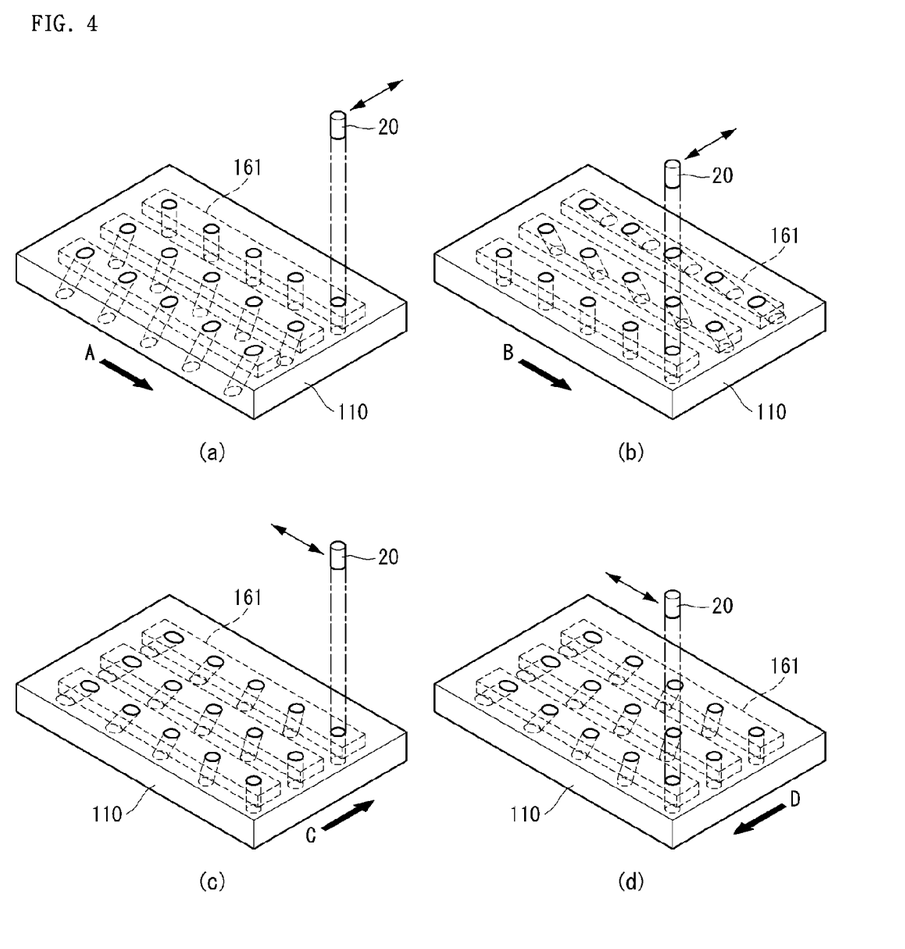
FIG. 4 include diagrams showing examples of a position where a laser beam is irradiated, and examples of angles and horizontal sectional shapes of via holes according to a direction where the substrate moves in accordance with an embodiment of the present invention.
Figure 5:
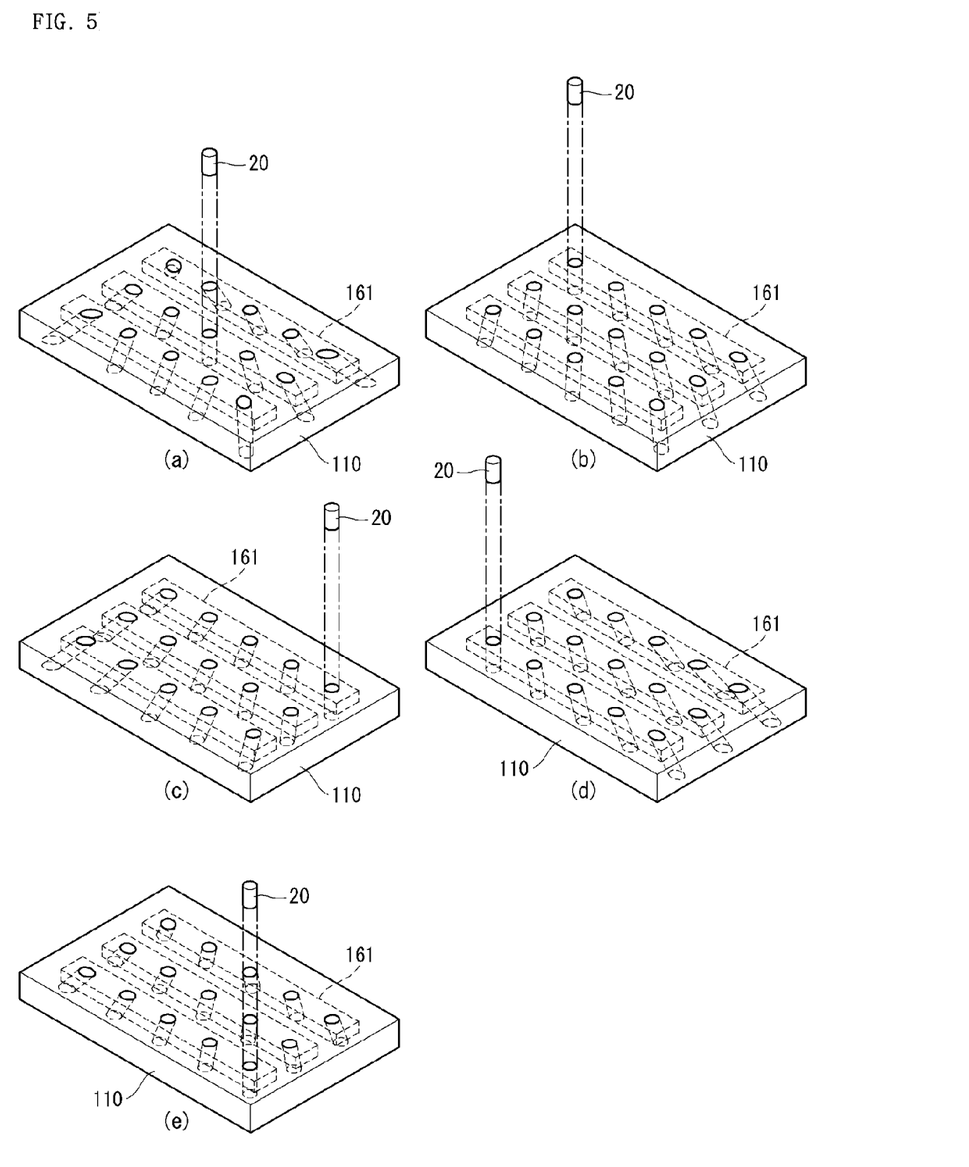
FIG. 5 include diagrams showing examples of angles and horizontal sectional shapes of via holes according to an initial position of a via hole formation apparatus in accordance with an embodiment of the present invention.
Figure 6:
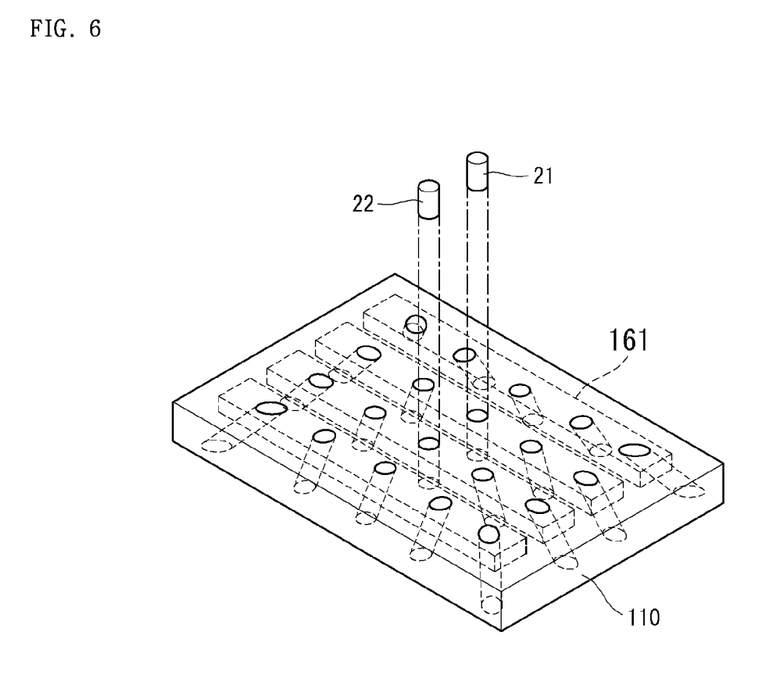
FIG. 6 is a diagram showing angles and horizontal sectional shapes of via holes according to the position of the substrate when the plurality of via holes are formed using two via hole formation apparatuses according to an embodiment of the present invention.
Figure 7:
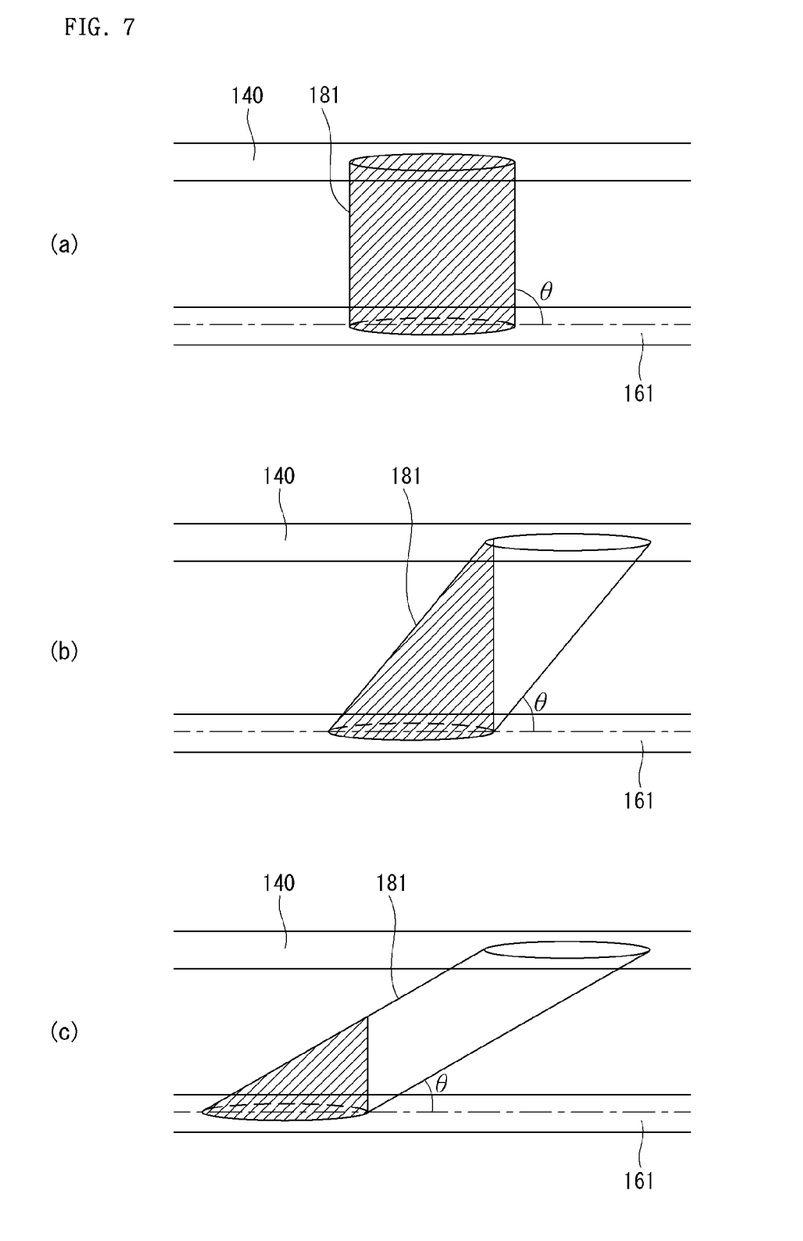
FIG. 7 include diagrams showing changes in the magnitude of a current collector for a front electrode existing within a via

FIG. 1 is a partial perspective view of a solar cell according to an embodiment of the present invention. FIG. 2 is a sectional view of the solar cell taken along line II-II in FIG. 1. FIG. 3 is a diagram showing via holes formed in a substrate according to an embodiment of the present invention. FIG. 4 includes diagrams showing examples of a position where a laser beam is irradiated, and examples of angles and horizontal sectional shapes of via holes according to a direction where the substrate moves in accordance with an embodiment of the present invention. a to e of FIG. 5 are diagrams showing examples of angles and horizontal sectional shapes of via holes according to an initial position of a via hole formation apparatus in accordance with an embodiment of the present invention. FIG. 6 is a diagram showing angles and horizontal sectional shapes of via holes according to the position of the substrate when the plurality of via holes are formed using two via hole formation apparatuses according to an embodiment of the present invention. FIG. 7 includes diagrams showing changes in the magnitude of a current collector for a front electrode existing within a via hole according to an angle of the via hole in accordance with an embodiment of the present invention.

Referring to FIG. 1, the solar cell 1 according to the embodiment of the present invention includes a substrate 110 having a plurality of via holes 181 formed therein, an emitter layer 120 placed in the substrate 110, an anti-reflective layer 130 placed on the emitter layer 120 on a surface (hereinafter referred to as 'front surface') of the substrate 110 on which light is incident, a plurality of first electrodes 140 (hereinafter referred to as 'front electrodes') placed on the emitter layer 120 on the front surface of the substrate 110 where the anti-reflective layer 130 is not placed, second electrode (hereinafter referred to as 'rear electrode') 150 placed on a surface (hereinafter referred to as 'rear surface') of the substrate 110 on which light is not incident and which is placed to face the front surface, a plurality of current collectors 161 (hereinafter, referred to as 'front electrode current collectors') for the front electrodes 140, a plurality of current collectors 162 (hereinafter, referred to as 'rear electrode current collectors') for the rear electrode 150 electricaly connected to the rear electrode 150, and a back surface field (BSF) unit (or layer) 170 interposed between the rear electrode 150 and the substrate 110. Here, the front electrode current collectors 161 are isolated from the rear electrode 150, are each placed in the via holes 181 and the emitter layer 120 adjacent to the via holes 181, and are coupled to the front electrodes 140.

The substrate 110 is a semiconductor substrate made of silicon having a first conductive type (e.g., a p conductive type). Here, the silicon may be single crystalline silicon, polycrystalline silicon, or amorphous silicon. In the case where the substrate 110 has a p conductive type, the substrate 110 may contain an impurity of a group III element, such as boron (B), gallium (Ga), or indium (In). However, the substrate 110 may be an n conductive type and may be made of semiconductor materials other than silicon. In the case where the substrate 110 has an n conductive type, the substrate 110 may contain an impurity of a group V element, such as phosphorous (P), arsenic (As), or antimony (Sb).

The substrate 110 has the plurality of via holes 181 penetrating therethrough and has a surface that is textured, thus having a textured surface (i.e., an uneven surface). The plurality of via holes 181 are formed in the substrate 110, and, more particularly, at respective portions where the plurality of front electrodes 140 and the front electrode current collectors 161 cross each other.

In the present embodiment, a longitudinal sectional shape of each of the via holes 181 when the via hole 181 is cut in a direction perpendicular to the central axis of the via hole 181 is circular, but is not limited thereto. For example, the longitudinal sectional shape of the via hole 181 may have a variety of shapes, such as an oval or a polygon.

The via hole 181 may have a different angle with the surface of the substrate 110 according to a position where the via hole 181 is formed. That is, the plurality of via holes 181 includes at least one via hole 181, formed in a direction substantially perpendicular to the surface of the substrate 110, and a plurality of via holes 181 inclined with respect to the surface of the substrate 110. Accordingly, there exist at least two via holes 181 with different angles, but there also exist the via holes 181 having the same angle according to their positions. Here, a tilt angle and a tilt direction of the via hole 181 for the surface of the substrate 110 vary depending on a position where the via hole 181 is formed in the substrate 110.

Further, a horizontal sectional shape of the via hole 181 when the via hole 181 is cut in parallel to the surface of the substrate 110 differs depending on an angle of the via hole 181. Thus, the sectional area of the via hole 181 also differs depending on the angle of the via hole 181. Accordingly, the via holes 181 having the same angle have a substantially similar horizontal sectional shape. In the present embodiment, since the longitudinal sectional shape of the via hole 181 is circular, the horizontal sectional shape of the via hole 181 is close to a circle with the angle of the via hole 181 becoming greater. Accordingly, the sectional area of the via hole 181 decreases. On the contrary, the horizontal sectional shape of the via hole 181 has an oval having a gradually wider width with the angle of the via hole 181 becoming smaller. Accordingly, the sectional area of the via hole 181 increases.

In the present embodiment, the angle of the via hole 181 ranges from about 45° to 90°. The difference in the angle between the via hole 181 having a maximum angle and the via hole 181 having a minimum angle is within a range of about 45°. In the present embodiment, the angle refers to, as described above, an angle formed by the via hole 181 and the surface of the substrate 110. The tilt angle refers to an acute angle of the via hole 181 inclined with respect to the surface of the substrate 110.

In the present embodiment, the tilt angle of the via hole 181 for the substrate 110 may be a tilt angle for a surface of the substrate 110 on which texturing has not been performed, but is not limited thereto.

The emitter layer 120 is an impurity portion having a second conductive type (e.g., an n conductive type) opposite to the conductive type of the substrate 110 and is configured to form a PN junction together with the semiconductor substrate 110.

Electrons-hole pairs (i.e., electric charges) generated by light incident on the substrate 110 are separated into electrons and holes by a built-in potential difference resulting from the PN junction. Consequently, the electrons move toward the n type and the holes move toward the p type. Accordingly, if the substrate 110 has a p conductive type and the emitter layer 120 have an n conductive type, the separated holes move toward the substrate 110, and the separated electrons move toward the emitter layer 120. Accordingly, the holes become the majority carriers in the substrate 110, and the electrons become the majority carriers in the emitter layer 120.

The emitter layer 120 forms the PN junction together with the substrate 110. Accordingly, in the case where the substrate 110 has an n conductive type unlike the present embodiment, the emitter layer 120 has a p conductive type. In this case, the separated electrons move toward the substrate 110, and the separated holes move toward the emitter layer 120.

In the case where the emitter layer 120 has an n conductive type, the emitter layer 120 may be formed by doping the substrate 110 with an impurity of a group V element, such as phosphorous (P), arsenic (As), or antimony (Sb). On the contrary, in the case where the emitter layer 120 has a p conductive type, the emitter layer 120 may be formed by doping the substrate 110 with an impurity of a group III element, such as boron (B), gallium (Ga), or indium (In).

The anti-reflective layer 130, made of silicon nitride (SiNx), silicon oxide (SiOx), etc., is formed on the emitter layer 120 on the front surface of the substrate 110. The anti-reflective layer 130 functions to reduce reflectance of light incident on the solar cell 1 and increase the selectivity of a specific wavelength region (or band) of incident light, thereby improving the efficiency of the solar cell 1. The anti-reflective layer 130 may have a thickness ranging from about 70 nm to about 80 nm. In some embodiments, the anti-reflective layer 130 may also be placed on sidewalls of the via holes 181. The anti-reflective layer 130 may be omitted, if necessary.

Although not shown in FIG. 1, for performing edge isolation of the substrate 110, the anti-reflective layer 130 and the underlying emitter layer 120 have exposure portions (not shown) exposing portions of the corners of the front surface of the substrate 110.

The plurality of front electrodes 140 are placed on the emitter layer 120 formed on the front surface of the substrate 110, and are electrically coupled to the emitter layer 120. The plurality of front electrodes 140 extend in a predetermined direction with the front electrode 140 being isolated from each other, and cover the via holes 181 placed beneath.

The front electrodes 140 collect electric charges (e.g., electrons) that move toward the emitter layer 120 and transfer the electric charges to the front electrode current collectors 161 electrically coupled thereto through the via holes 181. The front electrodes 140 are made of at least one conductive material. The conductive material may include, for example, at least one selected from the group consisting of nickel (Ni), copper (Cu), silver (Ag), aluminum (Al), tin (Sn), zinc (Zn), indium (In), titanium (Ti), gold (Au), and a combination thereof, but may be made of other conductive material.

The front electrode current collectors 161 are placed on the rear surface of the substrate 110. As shown in FIGS. 1 and 2, the front electrode current collectors 161, also referred to as bus bars, extend in a direction intersecting the front electrodes 140 placed on the front surface of the substrate 110.

The front electrode current collectors 161 are also made of at least one conductive material. The front electrode current collectors 161 are configured to intersect the front electrodes 140 and coupled to the front electrodes 140 through the via holes 181. Since the front electrode current collectors 161 are electrically coupled to the front electrodes 140, the front electrode current collectors 161 output electric charges, which are received from the front electrodes 140 to an external device.

The conductive material of the front electrode current collectors 161 may include, for example, at least one selected from the group consisting of nickel (Ni), copper (Cu), silver (Ag), aluminum (Al), tin (Sn), zinc (Zn), indium (In), titanium (Ti), gold (Au), and a combination thereof, but may be made of other conductive material. In the present embodiment, although the front electrode current collectors 161 are illustrated to include the same material as the front electrodes 140, the front electrode current collectors 161 may include different materials from the front electrodes 140.

The rear electrode 150 is placed on the rear surface of the substrate 110 and electrically coupled to the substrate 110. The rear electrode 150 is isolated from adjacent front electrode current collectors 161. The rear electrode 150 functions to collect electric charges (e.g., holes) moving toward the substrate 110.

The rear electrode 150 is made of at least one conductive material. The conductive material may include, for example, at least one selected from the group consisting of nickel (Ni), copper (Cu), silver (Ag), aluminum (Al), tin (Sn), zinc (Zn), indium (In), titanium (Ti), gold (Au), and a combination thereof, but may be made of other conductive material.

A plurality of exposure portions 182 is formed between the rear electrode 150 and the respective front electrode current collectors 161. Thus, the rear electrode 150, the front electrode current collectors 161, and the underlying emitter layer 120 include the plurality of exposure portions 182 exposing parts of the rear surface of the substrate 110. The plurality of exposure portions 182 are chiefly formed near the front electrode current collectors 161. Accordingly, electrical connections between the front electrode current collectors 161 for moving and collecting electrons or holes and the rear electrode 150 for collecting holes or electrons are disconnected by each of the exposure portions 182, thereby making smooth the movement of the electrons and the holes.

The rear electrode current collectors 162 are disposed in such a way as to electrically connect to the rear electrode 150. The rear electrode current collectors 162 are made of a conductive material. The conductive material may include, for example, at least one selected from the group consisting of nickel (Ni), copper (Cu), silver (Ag), aluminum (Al), tin (Sn), zinc (Zn), indium (In), titanium (Ti), gold (Au), and a combination thereof, but may be made of other conductive material.

The rear electrode current collectors 162 are disposed at regular intervals. Each of the rear electrode current collectors 162 includes a plurality of circular pads, but may include pads having various shapes, such as an oval or a square. Alternatively, the rear electrode current collector 162 may have a stripe shape extending in parallel to the front electrode current collectors 161.

The rear electrode current collectors 162 output electric charges (e.g., holes) received from the rear electrode 150 electrically coupled thereto, to an external device.

In the present embodiment, the number of each of the front electrode current collectors 161 and the rear electrode current collectors 162 may be 2 or more, but may vary, if necessary.

The BSF unit 170 is placed between the rear electrode 150 and the substrate 110. The BSF unit 170 is a region (e.g., an n+ region) with which an impurity having the same conductive type as the substrate 110 is doped at a concentration higher than that of the substrate 110.

A potential barrier is formed resulting from the difference in the impurity concentration between the substrate 110 and the BSF unit 170, thus hindering the migration of electrons toward the rear surface of the substrate 110. Accordingly, electrons and holes can be reduced or prevented from becoming recombined through a recombination of the electrons and the holes near the surface of the substrate 110.

In the solar cell 1 constructed as above, the plurality of via holes 181 formed in the substrate 110 are formed at the portions of the substrate 110 at which the front electrodes 140 intersect the front electrode current collectors 161, as described above.

As described above, the via holes 181 form different angles together with the surface of the substrate 110 depending on positions where the via holes 181 are formed. Here, the magnitude of an angle θ and a tilt direction change depending on positions where the via holes 181 are formed.

Assuming that, as shown in FIG. 3, the substrate 110 is divided into a total of 9 virtual regions with a longitudinal width and a traverse width being equally divided, an angle θ of each of the via holes 181 formed in a virtual region A1 placed at the center of the substrate 110 is about 90° with respect to the surface of the substrate 110. However, the angle θ of the via hole 181 gradually decreases with an increase in the distance from the virtual region A1 (i.e., closer to the edges of the substrate 110). In the present embodiment, the angle θ of the via hole 181 may range from about 45° to 90°.

Since the angle θ of the via hole 181 is about 45° at minimum and about 90° at maximum as described above, an average angle of each of the virtual regions A1 to A9 ranges from about 45° to 90°. In the present embodiment, the average angle of each of the virtual regions A1 to A9 ranges from about 50° to 85°.

Further, the tilt directions of the via holes 181 for the substrate 110 are oriented toward the virtual region A1 placed at the center of the substrate 110. That is, the tilt directions of the via holes 181 are oriented toward a via hole 181 having the greatest angle θ (i.e., a via hole 181 having the angle θ of about 90°) or a via hole 181 having an angle θ most close to about 90° when a via hole 181 having the angle θ of about 90° does not exist, from among the via holes 181 formed in the virtual region A1 at the center of the substrate 110.

When the plurality of via holes 181 is formed in the substrate 110 as shown in a to d of FIG. 4, the angle, horizontal sectional shape, sectional area, etc. of the via holes 181 formed in the substrate 110 vary depending on a position relation between the substrate 110 and a laser beam irradiation apparatus 20, an irradiation (operation) direction of the substrate 110 or the laser beam irradiation apparatus 20, etc. In the present embodiment, it is illustrated that an example of a via hole formation apparatus is the laser beam irradiation apparatus 20, but not limited thereto.

For example, the plurality of via holes 181 may be formed while moving both the substrate 110 and the laser beam irradiation apparatus 20 as shown in a to d of FIG. 4.

In FIG. 4, the number of the front electrode current collectors 161 is three and, as described above, the plurality of via holes 181 are chiefly formed at points where the front electrodes 140 intersect the front electrode current collectors 161. Accordingly, the via holes 181 are formed along each of the front electrode current collectors 161, as shown in FIG. 4. The number of the via holes 181 and the number of the front electrode current collectors 161 may be changed. In some embodiments, the number of the front electrode current collectors 161 may be two or four or more.

a and b of FIG. 4 show the via holes 181 formed in the substrate 110 in the case where the substrate 110 moves in the direction of an arrow "A" or "B" (approximately an X-axis direction) and where the laser beam irradiation apparatus 20 irradiates a laser beam while moving up and down. As shown in a and b of FIG. 4, the via holes 181 formed in the same row have substantially the same angle, and the via holes 181 formed in different rows have different angles. The angles of the via holes 181 decrease toward the lower side [a of FIG. 4] of the substrate 110 or the upper side [b if FIG. 4] of the substrate 110, and so the horizontal sectional area of each via hole 181 increases. That is, the horizontal sectional shape of the via hole 181 becomes close to a circle (at this time, the angle is about 90°) toward the upper side [a of FIG. 4] or the lower side [b of FIG. 4] of the substrate 110.

c and d of FIG. 4 show the via holes 181 formed in the substrate 110 in the case where the substrate 110 moves in the direction of an arrows "C" or "D" (approximately, a Y-axis direction) and where the laser beam irradiation apparatus 20 irradiates a laser beam while moving left and right. As shown in c and d of FIG. 4, the via holes 181 formed in the same column have substantially the same angle, and the via holes 181 formed in different columns have different angles. Accordingly, the angles of the via holes 181 decrease toward the left side of the substrate 110, and so the horizontal sectional shape of each via hole 181 becomes close to a circle toward the right side of the substrate 110.

In the case where, as described above, the plurality of via holes 181 are formed while moving both the substrate 110 and the laser beam irradiation apparatus 20 in a predetermined direction, the via holes 181 have varying angles according to their positions, and so the horizontal sectional shape and the sectional area of each via hole 181 also changes. Further, two or more via holes 181 having the same angle are formed according to a direction where the substrate 110 moves and a direction where the laser beam irradiation apparatus 20 irradiates a laser beam. In particular, there exist a row or a column consisting of via holes 181 having the same angle according to a shape where the via holes 181 are arranged (e.g., in the case where the predetermined number of via holes 181 is arranged in a matrix form in the row and column directions of the substrate 110).

Consequently, the angle (and the horizontal sectional shape and sectional area) of each via hole 181 changes according to an irradiation distance between the laser beam irradiation apparatus 20 and the substrate 110, varying depending on the position of the substrate 110. The angle of the via hole 181 decreases with the longer irradiation distance, the via holes 181 formed by laser beams having different irradiation distances have different angles (and different horizontal sectional shapes and sectional areas). The via holes 181 formed by laser beams having the same irradiation distance have substantially the same angle (and the same horizontal sectional shape and sectional area).

Moreover, the laser beam irradiation apparatus 20 may irradiate a laser beam and the substrate 110 may move in various directions other than the directions where the laser beam irradiation apparatus 20 irradiates a laser beam and the directions where the substrate 110 moves as shown in a to d of FIG. 4. Even in this case, the angle, horizontal sectional shape, and sectional area of each via hole 181 change according to the irradiation distance of the laser beam.

In some embodiments, unlike the examples shown in FIG. 4, the plurality of via holes 181 may be formed in the substrate 110 while changing only the position where the laser beam irradiation apparatus 20 irradiates a laser beam after fixing the substrate 110, as shown in FIG. 5.

a to e of FIG. 5 are diagrams showing examples of an angle and horizontal sectional shape of the via hole according to an initial position of the via hole formation apparatus in accordance with an embodiment of the present invention.

In order to form the via holes 181, the substrate 110 is placed at an initial position in response to the laser beam irradiation apparatus 20, and the via holes 181 are formed at corresponding positions while changing a direction where the laser beam irradiation apparatus 20 irradiates a laser beam. In the present embodiment, a position of the laser beam irradiation apparatus 20, corresponding to the substrate 110 when the substrate 110 moves to the initial position, is called the initial position of the laser beam irradiation apparatus 20. Consequently, the laser beam irradiation apparatus 20 forms the via holes 181 while changing the irradiation direction of the laser beam at the initial position.

a of FIG. 5 shows an example in which the initial position of the laser beam irradiation apparatus 20 is right at (or close to) the center of the substrate 110. b of FIG. 5 shows an example in which the initial position of the laser beam irradiation apparatus 20 is at an upper left corner of the substrate 110. c of FIG. 5 shows an example in which the initial position of the laser beam irradiation apparatus 20 is at an upper right corner of the substrate 110. Further, d of FIG. 5 shows an example in which the initial position of the laser beam irradiation apparatus 20 is at a lower left corner of the substrate 110, and e FIG. 5 shows an example in which the initial position of the laser beam irradiation apparatus 20 is at a lower right corner of the substrate 110.

As shown in a to e of FIG. 5, the irradiation angle of a laser beam becomes small with an angle of the laser beam irradiation apparatus 20 with respect to the substrate 110 (i.e., an irradiation angle of the laser beam) becoming distant from the initial position having an angle of about 90° (i.e., with an irradiation distance of the laser beam irradiation apparatus 20 becoming longer). Accordingly, the via holes 181 have smaller angles and wider sectional areas, as shown in a to e of FIG. 5. That is to say, when the longitudinal sectional shape of the via hole 181 is a circle, the horizontal sectional shape of the via hole 181 becomes close to a circle with the irradiation distance of the laser beam irradiation apparatus 20 from the initial position becoming shorter, and so the sectional area of the via hole 181 decreases.

Here, the tilt direction of the via hole 181 radiates in the irradiation direction of a laser beam as shown in a to e of FIG. 5. Accordingly, the plurality of tilted via holes 181 are oriented toward a via hole 181 having the greatest angle. That is, the plurality of tilted via holes 181 is oriented toward the initial position of the laser beam irradiation apparatus 20.

As described above with reference to FIG. 4, in FIG. 5, the horizontal sectional shape, sectional area, and angle of each of the via holes 181 formed in the substrate 110 vary depending on the irradiation distance of the laser beam, varying depending on the position of the substrate 110. Accordingly, the via holes 181 formed at the same irradiation distance from the initial position have the same angle, and the via holes 181 formed at different irradiation distances from the initial position have different angles. Consequently, the angle (and the horizontal sectional shape and sectional area) of each of the via holes 181 formed at the same distance from a via hole 181 having a greatest angle becomes the same.

FIGS. 4 and 5 show the examples in which the via holes 181 are formed at corresponding portions of the substrate 110 using a single via hole formation apparatus 20. However, in some embodiments, the plurality of via holes 181 may be formed using two or more via hole formation apparatuses.

For example, as shown in FIG. 6, the plurality of via holes 181 may be formed using two via hole formation apparatuses 21 and 22. In this case, the via holes 181 formed by the different via hole formation apparatuses 21 and 22 may have the same angle, and so may have the same horizontal sectional shape and sectional area. That is to say, the number of via holes 181 each having an angle may be identical to at least the number of via hole formation apparatus.

Further, from FIGS. 4 to 6, it can be seen that the inclined via holes 181 are oriented toward a via hole 181 having the greatest angle because the tilt direction of the via hole 181 is related to the irradiation direction of the laser beam.

The angle θ of the via hole 181, the amount of the front electrode current collector 161 existing within the via hole 181, and a connection relation between the front electrode current collector 161 and the front electrode 140 depending on the amount of the front electrode current collector 161 are described below with reference to FIG. 7.

a of FIG. 7 is a diagram showing the amount of the front electrode current collector existing within the via hole when the angle of the via hole is about 90°. b of FIG. 7 is a diagram showing the amount of the front electrode current collector existing within the via hole when the angle of the via hole is about 45°. c of FIG. 7 is a diagram showing the amount of the front electrode current collector existing within the via hole when the angle of the via hole is about 30.

When the angle θ of the via hole 181 is about 90° as shown in a of FIG. 7, the front electrode current collector 161 is completely filled within the via hole 181. That is, the conductive material for forming the front electrode current collector 161 is completely filled from a direction where the conductive material is introduced into the via hole 181 (e.g., the bottom surface of the substrate 110 in FIG. 7) to the top surface of the substrate 110, and so the front electrode current collector 161 is completely filled within the via hole 181. Accordingly, the contact between the front electrode current collector 161 existing within the via hole 181 and the front electrode 140 existing on the via hole 181 is facilitated.

When the angle θ of the via hole 181 is about 45° as shown in b of FIG. 7, the front electrode current collector 161 is filled within the via hole 181 only about half. That is, the conductive material for forming the front electrode current collector 161 is filled from the bottom surface of the substrate 110 to the top surface thereof, but the conductive material does not reach the entire top surface of the via hole 181 because of the tilt of the via hole 181 and fills only part of the top surface of the via hole 181. Accordingly, the front electrode current collector 161 existing on part of the top surface of the via hole 181 comes into contact with the front electrode 140 existing on the via hole 181.

Further, when the angle θ of the via hole 181 is about 30° smaller than 45° as shown in c of FIG. 7, the front electrode current collector 161 is filled up to a middle potion of the via hole 181. That is, the conductive material for forming the front electrode current collector 161 is filled from the bottom surface of the substrate 110 to the top surface thereof, but does not reach up to the top surface of the via hole 181 because the introduction of the conductive material is hindered by the tilt surface of the via hole 181. Accordingly, since the front electrode current collector 161 existing in part of the via hole 181 does not come into contact with the front electrode 140 existing on the via hole 181, the front electrode 140 and the front electrode current collector 161 are not electrically connected to each other through the via hole 181.

With the amount of the front electrode current collectors 161 (i.e., a connection member existing within the via hole 181) increasing as described above, the connection between layers through the via hole 181 is facilitated.

In the present embodiment, the angle of the via hole 181 ranges from about 45° to about 90°. Accordingly, an electrical connection between the front electrodes 140 (i.e., upper layers) and the front electrode current collectors 161 (i.e., lower layers) is facilitated. Consequently, the failure rate of the solar cell 1 resulting from an incomplete connection between the front electrodes 140 and the front electrode current collectors 161 can be reduced.

The solar cell 1 constructed as above according to the present embodiment is a metal wrap through (MWT) solar cell in which the front electrode current collectors 161 are placed on the rear surface of the substrate 110 on which light is not incident, and the front electrode current collectors 161 and the front electrodes 140 placed on the front surface of the substrate 110 are connected to each other using the plurality of via holes 181. The operation of the solar cell 1 is described below.

When light is irradiated to the solar cell 1 and incident on the semiconductor substrate 110 through the anti-reflective layer 130 and the emitter layer 120, electrons-hole pairs are created in the semiconductor substrate 110 by light energy. Here, since the surface of the substrate 110 has experienced the texturing processing, the reflectance of light from the front surface of the substrate 110 decreases, and the light is confined within the solar cell 1 through the incident and reflection operations on the textured surface. Accordingly, the absorption rate of light is increased, and so the efficiency of the solar cell 1 is improved. Incidentally, the amount of light incident on the substrate 110 is further increased because the reflection loss of light incident on the substrate 110 is reduced by the anti-reflective layer 130.

The electrons-hole pairs are separated from each other by the PN junction of the substrate 110 and the emitter layer 120. The separated electrons move toward the emitter layer 120 having an n conductive type, and the separated holes move toward the substrate 110 having a p conductive type. The electrons move toward the emitter layer 120 as described above are collected by the front electrodes 140 and then move toward the front electrode current collectors 161 electrically coupled to the front electrodes 140 through the via holes 181. The holes move toward the substrate 110 are collected by corresponding rear electrodes 150 through adjacent BSF unit 170 and then move toward the rear electrode current collectors 162.

As described above, since the angle of each via hole 181 ranges from about 45° to about 90°, connections between the front electrodes 140 and the front electrode current collectors 161 placed in the via holes 18 is reliable. Accordingly, the failure rate of the solar cell 1 is decreased, and the operational efficiency of the solar cell 1 is improved.

When the front electrode current collectors 161 and the rear electrode current collectors 162 are interconnected by electric wires, current is caused to flow and used externally as electric power.

According to a related method of forming a solar cell, the method includes forming a plurality of via holes in a substrate of a first conductive type; forming an emitter layer in the substrate, the emitter layer being a second conductive type opposite to the first conductive type; forming a plurality of first electrodes electrically coupled to the emitter layer; forming a plurality of current collectors electrically coupled to the first electrodes through the plurality of via holes; and forming a plurality of second electrodes electrically coupled to the substrate, wherein the plurality of via holes are formed so that at least two via holes have different angles.

According to the embodiments of the present invention, connections between the first electrodes and the front electrode current collectors through the via holes is achieved safely. Accordingly, the failure rate of a solar cell can be decreased and the operational efficiency of the solar cell can be improved.

While the present invention has been shown and described in connection with the example embodiments thereof, those skilled in the art will appreciate that the present invention may be changed and modified in various ways without departing from the spirit and scope of the present invention as defined in the following claims.

What is claimed is:

1. A method of forming a solar cell, the method comprising:
   forming a plurality of via holes in a substrate of a first conductive type;
   forming an emitter layer at a first surface of the substrate, the emitter layer being a second conductive type opposite to the first conductive type;
   forming a plurality of first electrodes electrically coupled to the emitter layer;
   forming a plurality of current collectors on a second surface of the substrate, the plurality of current collectors being electrically coupled to the plurality of first electrodes through the plurality of via holes; and
   forming a plurality of second electrodes electrically coupled to the substrate on the second surface of the substrate,
   wherein the plurality of via holes are formed so that at least two via holes have different angles and the plurality of via holes are formed at respective portions where the plurality of first electrodes and the plurality of current collectors cross each other in the substrate, and the forming of the plurality of via holes is performed by one laser beam irradiation apparatus.

2. The method as claimed in claim 1, wherein at least two angles respectively corresponding to the at least two via holes are different depending on places of the substrate where the at least two via holes are formed.

3. The method as claimed in claim 1, wherein the plurality of via holes are formed so that at least two via holes have a same angle.

4. The method as claimed in claim 1, wherein the plurality of via holes are formed so that each of the different angles is about 45° to 90° with the substrate.

5. The method as claimed in claim 1, wherein the plurality of first electrodes and the plurality of current collectors are formed on opposite surfaces of the substrate.

6. The method as claimed in claim 1, further comprising forming a back surface field at the second surface of the substrate.

7. The method as claimed in claim 1, further comprising forming a plurality of second current collectors on the second surface of the substrate and coupled to the plurality of second electrodes.

8. The method as claimed in claim 1, further comprising forming an anti-reflective layer on the emitter layer.

* * * * *